(12) United States Patent
Kawaguchi et al.

(10) Patent No.: US 9,455,389 B2
(45) Date of Patent: Sep. 27, 2016

(54) THERMOELECTRIC CONVERSION ELEMENT, MANUFACTURING METHOD FOR THE THERMOELECTRIC CONVERSION ELEMENT, AND THERMOELECTRIC CONVERSION MODULE

(71) Applicants: Yasuhiro Kawaguchi, Kasugai (JP); Hideo Yumi, Kasugai (JP); Hiroki Kitano, Kasugai (JP); Kenta Takagi, Nagoya (JP); Kimihiro Ozaki, Nagoya (JP)

(72) Inventors: Yasuhiro Kawaguchi, Kasugai (JP); Hideo Yumi, Kasugai (JP); Hiroki Kitano, Kasugai (JP); Kenta Takagi, Nagoya (JP); Kimihiro Ozaki, Nagoya (JP)

(73) Assignees: National Institute of Advanced Industrial Science and Technology, Chiyoda-ku, Tokyo (JP); KITAGAWA INDUSTRIES CO., LTD., Inazawa-shi, Aichi (JP)

( * ) Notice: Subject to any disclaimer, the term of this patent is extended or adjusted under 35 U.S.C. 154(b) by 485 days.

(21) Appl. No.: 13/678,635

(22) Filed: Nov. 16, 2012

(65) Prior Publication Data

US 2013/0125948 A1    May 23, 2013

(30) Foreign Application Priority Data

Nov. 17, 2011    (JP) .................................. 2011-251712

(51) Int. Cl.
*H01L 35/32* (2006.01)
*H01L 35/34* (2006.01)
*H01L 35/20* (2006.01)

(52) U.S. Cl.
CPC ............... *H01L 35/32* (2013.01); *H01L 35/20* (2013.01); *H01L 35/34* (2013.01)

(58) Field of Classification Search
USPC ........................................................ 136/203
See application file for complete search history.

(56) References Cited

U.S. PATENT DOCUMENTS

| 4,279,292 | A  | * | 7/1981 | Swiatosz ........................ 165/61 |
|---|---|---|---|---|
| 4,497,973 | A  | * | 2/1985 | Heath et al. ................... 136/212 |
| 2007/0006911 | A1 | * | 1/2007 | Fukudome et al. ........... 136/201 |
| 2009/0007952 | A1 |   | 1/2009 | Kondoh et al. |
| 2009/0314324 | A1 | * | 12/2009 | Murai et al. .................. 136/201 |
| 2011/0146741 | A1 |   | 6/2011 | Hida et al. |

FOREIGN PATENT DOCUMENTS

| JP | S6347514 A  | 2/1988 |
|---|---|---|
| JP | H08335721 A | 12/1996 |

(Continued)

OTHER PUBLICATIONS

Japanese Office Action issued in corresponding Japanese Patent Application No. 2011-251712 mailed Feb. 17, 2015.

*Primary Examiner* — Marla D McConnell
*Assistant Examiner* — Sadie White
(74) *Attorney, Agent, or Firm* — Davis & Bujold PLLC; Michael J. Bujold (57) ABSTRACT

In a thermoelectric conversion module, each of a p-type element and an n-type element is configured by aligning a plurality of particles in series and connecting the particles to each other. Around a connection part in which the particles are connected to each other, a protrusion is protruded. The protrusion has a shape of continuously extending around the entire periphery of the connection part. The protrusion may be partly interrupted, but in such a case, a circumferential length of one interrupted portion is less than one half of the periphery of the connection part.

8 Claims, 3 Drawing Sheets

(56) References Cited

FOREIGN PATENT DOCUMENTS

| | | |
|---|---|---|
| JP | H0969653 A | 3/1997 |
| JP | H104217 A | 1/1998 |
| JP | H10303468 A | 11/1998 |
| JP | 2004315884 A | 11/2004 |
| JP | 4524382 B2 | 8/2010 |
| JP | 2011129832 A | 6/2011 |
| JP | 2011129838 A | 6/2011 |
| WO | 2006043514 A1 | 4/2006 |

* cited by examiner

FIG.1A
LOW TEMPERATURE SIDE

HIGH TEMPERATURE SIDE

THERMOELECTRIC CONVERSION ELEMENT, MANUFACTURING METHOD FOR THE THERMOELECTRIC CONVERSION ELEMENT, AND THERMOELECTRIC CONVERSION MODULE

CROSS-REFERENCE TO RELATED APPLICATIONS

This application claims the benefit of Japanese Patent Application No. 2011-251712 filed Nov. 17, 2011 in the Japan Patent Office, the disclosure of which is incorporated herein by reference.

BACKGROUND

The present invention relates to a thermoelectric conversion element utilized for performing thermoelectric power generation by the Seebeck effect or thermoelectric cooling (electronic cooling) by the Peltier effect, a manufacturing method for the thermoelectric conversion element, and a thermoelectric conversion module provided with the thermoelectric conversion element.

Conventionally, as an example of the thermoelectric conversion module utilized for performing thermoelectric power generation or thermoelectric cooling, a planar thermoelectric conversion module having a structure in which a plurality of p-type elements composed of p-type thermoelectric material and a plurality of n-type elements composed of n-type thermoelectric material are two-dimensionally arranged is known. In such a planar thermoelectric conversion module, a plurality of electrodes are provided on both a top face and a bottom face of the module, and one of the p-type elements and one of the n-type elements are electrically connected to each other via each of the electrodes. Thus, the plurality of p-type elements and the plurality of n-type elements are alternately connected in series.

When a temperature difference (temperature gradient) is applied on a top face side and a bottom face side of such a thermoelectric conversion module, the p-type element has a high potential on a low temperature side and a low potential on a high temperature side, while the n-type element has a high potential on a high temperature side and a low potential on a low temperature side. As a result, an electric current flows from the p-type element to the n-type element on the low temperature side, and an electric current flows from the n-type element to the p-type element on the high temperature side.

By the way, the above-described p-type element and n-type element were conventionally manufactured by melting or sintering a raw material composition having the same composition as that of the p-type thermoelectric material and the n-type thermoelectric material; cutting out block-shaped molded articles from the melted or sintered composition by mechanical processing (cutting processing); and arranging the obtained molded articles on a substrate and connecting the arranged articles in series.

However, since the thermoelectric material is likely to have a low mechanical strength, minute precision processing was difficult to be conducted, and reduction in size and thickness was difficult to be achieved. Also, there was a problem that yields come to be low in the cutting out processing of molded articles.

Furthermore, when a thermoelectric material having excellent thermal conductivity is utilized and an element cut out into a block shape is used, even if a large temperature difference is applied to the top and bottom faces of the thermoelectric conversion module, heat is easily transmitted to an inside of the element. Therefore, there was another problem that a sufficient temperature difference is not developed between both ends of the element.

Japanese Patent No. 4524382 proposed that a shape of the element is devised so that a large temperature difference between both ends of the element can be developed and that reduction in size of the thermoelectric power generation module can also be realized.

In Japanese Patent No. 4524382, at least one of the p-type and n-type elements has a shape of a plurality of spheres combined, and a narrowed portion having the smallest cross-sectional area is formed in a connection part of the neighboring spheres. By using such an element, heat flux is delayed at the narrowed portion, so that heat becomes more difficult to be transmitted between both ends of the element than in the case of the element cut out into a block shape. Accordingly, the temperature difference between both ends of the element becomes larger, thereby enabling improvement of the thermoelectric conversion performance of the thermoelectric conversion module.

Also, if the performance (electromotive force) of each element is improved as described above, the required performance can be ensured even with a smaller element. Therefore, the weight, thickness, and size of the thermoelectric conversion module can be reduced.

SUMMARY

Since the element (the p-type element or the n-type element) having a shape of a plurality of spheres combined as described in Japanese Patent No. 4524382 includes the above-described narrowed portion, mechanical strength is difficult to be ensured at the narrowed portion as compared to in the case of the element cut out into a block shape. Thus, there has still been room for improvement in that the structure of the element is likely to be weakened.

In particular, when the above-described narrowed portion is present, the bending strength of the element is easy to be reduced as compared to in the case of the block-shaped element without the narrowed portion, so that when a force of bending the element acts, the element tends to be easily broken at the narrowed portion. For this reason, in order to inhibit the element from bending at the narrowed portion, the element can be used only in applications in which excessive shock and vibration causing the element to be broken are not transmitted. Thus, there has been a problem that the application of the element is limited.

As more specific example, when the thermoelectric conversion module is installed in a vehicle, there is a possibility that reasonable shock and vibration are added to the thermoelectric conversion module while the vehicle is moving. For this reason, if there is a possibility that such shock and vibration lead to fracture of the element, the thermoelectric conversion module with such an element employed come to be difficult to be used in an application in which the module is installed in a vehicle.

Also, for example, when the thermoelectric conversion module is installed in a mobile device and the like, there is also a possibility that reasonable shock is added when the mobile device falls or bumps against an obstacle. For this reason, if there is a possibility that such shock leads to fracture of the element, the thermoelectric conversion module with such an element employed come to be difficult to be used in an application in which the module is installed in a mobile device.

An aspect of the present invention is to provide a thermoelectric conversion element which has improved mechanical strength more than a conventional product in spite of having a similar structure to the conventional product in that two or more particles each composed of thermoelectric material are aligned in series and connected to each other, a manufacturing method for the thermoelectric conversion element, and a thermoelectric conversion module provided with the thermoelectric conversion element.

Hereinafter, the structure employed in the present invention will be described.

The thermoelectric conversion element according to the present invention is a thermoelectric conversion element configured by aligning two or more particles composed of thermoelectric material in series and connecting the particles to each other, wherein the particles connected to each other are directly connected to each other in a state that the particles are pressed against each other to a position where a part of each of the particles before connected constitutes mutual overlapping in space.

Around this connection part, a protrusion is protruded. The protrusion is formed with the thermoelectric material pushed out from a region corresponding to a portion constituting the mutual overlapping. The protrusion has a shape of continuously extending around an entire periphery of the connection part, or a shape in which one or more interrupted portions exist in a range of the entire periphery of the connection part, but a circumferential length of an interrupted portion having the longest circumferential length among the one or more interrupted portions is less than one half of the periphery of the connection part.

According to the thermoelectric conversion element configured as above, since two or more particles composed of thermoelectric material are aligned in series and connected to each other, the narrowed portion can be formed in the connection part between the particles. Therefore, according to the thermoelectric conversion element having such a structure, when a temperature difference is applied between both ends of the element, heat flux is delayed at the narrowed portion thereby increasing the temperature difference between both ends of the element. Thus, the thermoelectric conversion performance of the thermoelectric conversion element can be improved.

Also, in this thermoelectric conversion element, the particles connected to each other are directly connected to each other in a state that the particles are pressed against each other to a position where a part of each of the particles before connected constitutes mutual overlapping in space. Around this connection part, a protrusion is protruded. The protrusion is formed with the thermoelectric material pushed out from a region corresponding to a portion constituting the mutual overlapping.

In addition, the protrusion has a shape of continuously extending around an entire periphery of the connection part, or a shape in which one or more interrupted portions exist in a range of the entire periphery of the connection part, but a circumferential length of an interrupted portion having the longest circumferential length among the one or more interrupted portions is less than one half of the periphery of the connection part.

That is, the protrusion exists around the entire periphery of the connection part; or the protrusion does not extends around the entire periphery of the connection part, but exists in a position where the interrupted portion extends around less than one half of the periphery of the connection part at longest. When the above-described protrusion is provided in such a range, as compared to in the case of the element without the protrusion provided thereon, the mechanical strength of the element, in particular, the bending strength and tensile strength thereof, are improved. Thus, a structure in which the element is unlikely to be broken and fracture can be obtained.

Various reasons why mechanical strength is improved by providing the protrusion are presumed. For example, in the case that the protrusion exits within such a range, when the periphery of the connection part is divided in half, one protrusion always exist in any each range. Accordingly, when a force of bending the connection part acts, at least one protrusion comes to always exist in the region where two particles are approaching each other by the bending force.

Therefore, it is considered that the protrusion existing in the region where two particles are approaching each other inhibits the element from bending in a direction of two particles approaching each other, so that the bending strength is increased as compared to in the case of the element without the protrusion in its equivalent position. Accordingly, a structure in which the element is unlikely to be broken can be obtained.

Also, in the case of the element without the equivalent to the protrusion provided thereon, the cross-sectional shape of the narrowed part formed in the connection portion comes to be a shape of tapered notch around almost the entire periphery. In contrast, when the above-described protrusion exits, the cross-sectional shape of the narrowed part in the corresponding portion comes to be a shape in which a tip of the notch is buried with the protrusion. For this reason, it is considered that the element without the equivalent to the protrusion provided thereon is more likely to have a stress concentrated on a location corresponding to the tip of the notch, thereby to be likely to fracture at this location, and that when the protrusion is provided, the stress concentrated on the connection part can be reduced, thereby improving bending strength and tensile strength.

To the extent that the inventors have experimentally confirmed, a reasonable effect of improving mechanical strength by the protrusion can be expected when a circumferential length of the above-described interrupted portion is less than one half of the periphery of the connection part. However, in order to enhance the effect, the circumferential length of the interrupted portion is preferably less than one third of the periphery of the connection part, and in order to further enhance the effect, the circumferential length of the interrupted portion is preferably less than one quarter of the periphery of the connection part. It is also preferable that the protrusion exists around the entire periphery of the connection part, since the effect of improving mechanical strength is enhanced.

Also, in the above-described thermoelectric conversion element, various methods for connecting the particles may be considered. An example of such methods include a method in which the particles to be connected to each other are contacted to each other, and applied with a load of pressing both particles against each other; and in such a state, a pulsed electrical current is passed through a contact point of both particles, so that the material in the contact point of both particles is locally melted by resistance heating caused by the pulsed electrical current, and both particles are welded. Such a method is preferable since an element excellent in both thermoelectric conversion performance and mechanical strength can be obtained.

A manufacturing method for the thermoelectric conversion element according to the present invention is a manufacturing method for a thermoelectric conversion element configured by aligning two or more particles composed of thermoelectric material in series and connecting the particles to each other.

The method comprises a step of contacting the particles to be connected to each other and applying a load of pressing both particles against each other; and in such a state, passing a pulsed electrical current through a contact point of both particles so that the thermoelectric material in a contact point of both particles is locally melted by resistance heating caused by the pulsed electrical current and both particles are welded, thereby directly connecting the particles to be connected to each other in a state of pressing the particles against each other to a position where a part of each of the particles before connected constitutes mutual overlapping in space.

In the step, a protrusion is protruded. The protrusion is formed with the thermoelectric material pushed out from a region corresponding to a portion constituting the mutual overlapping around the connection part of the particles connected to each other. The protrusion has a shape of continuously extending around the entire periphery of the connection part, or a shape in which one or more of interrupted portions exist in a range of the entire periphery of the connection part, but a circumferential length of an interrupted portion having a longest circumferential length among the one or more interrupted portions is less than one half of the periphery of the connection part.

By the manufacturing method as described above, the above-described thermoelectric conversion element according to the present invention can be manufactured.

The thermoelectric conversion module according to the present invention is a thermoelectric conversion module in which a plurality of p-type elements each composed of p-type thermoelectric material and a plurality of n-type elements each composed of n-type thermoelectric material are arranged in parallel with a space provided therebetween; and on a first end side of the p-type elements and the n-type elements, one of the p-type elements and one of the n-type elements are electrically connected via an electrode, and on a second end side of the p-type elements and the n-type elements, one of the p-type elements and one of the n-type elements are electrically connected via an electrode between elements different from the elements electrically connected on the first end side, so that one or more sets of structures, each including some of the p-type elements and some of the n-type elements alternately connected in series, are formed.

In addition, in the thermoelectric conversion element, the particles connected to each other are directly connected in a state that the particles are pressed against each other to a position where a part of each of the particles before connected constitutes mutual overlapping in space. Around this connection part, a protrusion is protruded. The protrusion is formed with the thermoelectric material pushed out from a region corresponding to a portion constituting the mutual overlapping.

The protrusion has a shape of continuously extending around the entire periphery of the connection part, or a shape in which one or more interrupted portions exist in a range of the entire periphery of the connection part, but a circumferential length of an interrupted portion having a longest circumferential length among the one or more interrupted portions is less than one half of the periphery of the connection part.

According to the thermoelectric conversion module configured as described above, the thermoelectric conversion element installed in the module is provided with a structure corresponding to the thermoelectric conversion element of the present invention. Therefore, the operation and effect as described on the thermoelectric conversion element of the present invention are exerted.

Also, since the temperature difference between both ends of the element increases, the thermoelectric conversion performance of the thermoelectric conversion module can be improved. Furthermore, although the element includes the narrowed portion formed thereon by connecting the particles, the narrowed portion is provided with the above-described protrusion. Therefore, mechanical strength is increased as compared to in the case of the element without the protrusion in its equivalent position. Accordingly, a structure in which the element is unlikely to be broken and fracture can be achieved.

In this thermoelectric conversion module, since an element excellent in both thermoelectric conversion performance and mechanical strength can be obtained, it is also preferable that the particles to be connected to each other are contacted to each other, and applied with a load of pressing both particles against each other; and in such a state, a pulsed electrical current is passed through a contact point of both particles, so that the material in the contact point of both particles is locally melted by resistance heating caused by the pulsed electrical current, and both particles are welded.

BRIEF DESCRIPTION OF THE DRAWINGS

The invention will now be described below, by way of example, with reference to the accompanying drawings, in which.

DETAILED DESCRIPTION OF THE PREFERRED EMBODIMENT

[Structure of Thermoelectric Conversion Module]

Figure 1A:
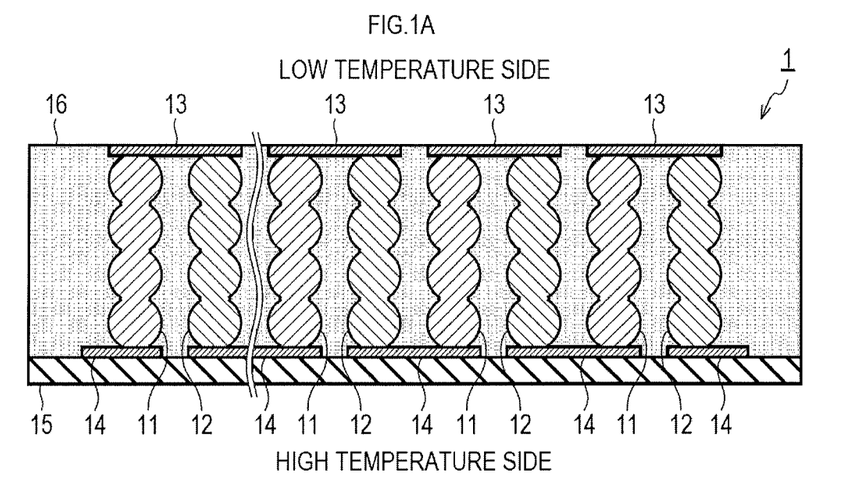
FIG. 1A is a cross-sectional view of a thermoelectric conversion module.

As shown in FIG. 1A, a thermoelectric conversion module 1 includes a plurality of p-type elements 11 each composed of p-type thermoelectric material ($Fe_2V_{0.9}Ti_{0.1}Al$ in the present example) and a plurality of n-type elements 12 each composed of n-type thermoelectric material ($Fe_2VAl_{0.9}Si_{0.1}$ in the present example). The p-type element 11 and the n-type element 12 are arranged in parallel with a space provided therebetween.

On a first end side (a low temperature side shown in FIG. 1A) of each of the p-type element 11 and the n-type element 12, one p-type element 11 and one n-type element 12 are electrically connected via an electrode 13. Also, on a second end side (a high temperature side shown in FIG. 1A) of each element, one p-type element 11 and one n-type element 12 are electrically connected via an electrode 14, between the elements different from those electrically connected via the electrode 13 on the first end side. The electrode 14 is formed on a surface of a substrate 15.

Also, the p-type element 11 and the n-type element 12 are also arranged in a direction vertical to a paper surface on which FIG. 1A is drawn, although those elements are not shown in FIG. 1A. All of the plurality of p-type elements 11 and the plurality of n-type elements 12 located within the thermoelectric conversion module 1, including those p-type elements 11 and n-type elements 12 which do not appear in FIG. 1A, are alternately connected in series.

Furthermore, a reinforcement part 16 formed with a resin composition filled between those elements is provided between the plurality of p-type elements 11 and the plurality of n-type elements 12. This reinforcement part 16 was formed with silicone resin-based potting material. In the present example, the reinforcement part 16 was formed by potting the elements 11 and 12 on the substrate 15 with a resin composition (viscosity: 500 mPa·s) in which a two liquid-type silicone gel (SE1885A and SE1885B manufactured by Dow Corning Toray Co., Ltd.) is blended at a weight ratio of 50:50.

[Structure of Thermoelectric Conversion Element]

For ease of discussion, the structure of the element 11 will be described below. It is understood that the element 12 has the same structure as of the element 11. In this thermoelectric conversion module 1, the p-type element 11 has a structure in which, as shown in an enlarged view of FIG. 1B, a plurality (four in the present example) of particles 11a (spherical particles having a diameter of 500 μm in the present example) are aligned in series and connected to each other. In addition, each of protrusions 11b protrudes around a connection part in which the particles 11a are connected to each other. In the case of the present example, the protrusion 11b is shaped so as to continuously extend around the entire periphery of the connection part.

Figure 2A:
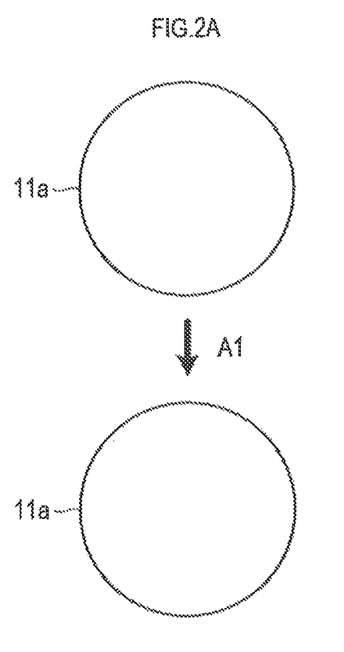
FIGS. 2A to 2D are illustrative views for explaining a procedure for connecting particles which constitute the thermoelectric conversion element.

The particles 11a and 11a that are placed next to each other are, as shown in FIG. 2A, configured such that one particle 11a is pressed against the other particle 11a in a direction of an arrow A1 in FIG. 2A, so that a predetermined load is applied between both particles 11a and 11a. In such a state, a pulsed electrical current is passed through a contact point of both particles 11a and 11a, so that the material in the contact point of both particles 11a and 11a is locally melted by resistance heating caused by the pulsed electrical current, and both particles 11a and 11a are welded.

When this welding is performed, the magnitude of the load (a force of pressing the particles against each other) applied between the particles 11a and 11a is adjusted at 1 N or more, and the electrical energy of the pulsed electrical current applied is adjusted at 0.4 J or more. Accordingly, as shown with a phantom line in FIG. 2B, both particles 11a and 11a are pressed against each other to the position where a part of each particle before connected constitutes mutual overlapping in space (a range indicated by hatched lines in FIG. 2B), and in such a state, both particles 11a and 11a are directly connected.

Figure 2B:
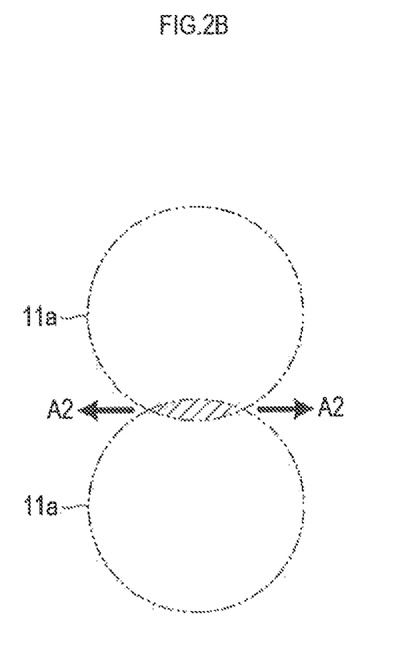
Figure 2C:
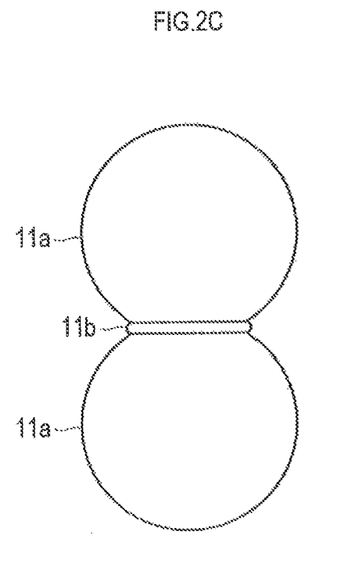

At this time, the thermoelectric material which makes up the particle 11a is pushed out from a region corresponding to a portion constituting the above-described mutual overlapping in a direction indicated by an arrow A2 in FIG. 2B around the connection part of the particles 11a and 11a connected to each other. With the pushed-out thermoelectric material, the protrusion 11b shown in FIG. 2C is formed.

More particularly, in the present embodiment, in order to form the protrusion 11b which is required in a desired range around the connection part, a pressing force of pressing the particles 11a and 11a against each other when welded, and the electrical energy input for welding are controlled, thereby optimizing an amount of the molten thermoelectric material to be protruded around the connection part and its protruding direction.

That is, the desired protrusion 11b may not be formed by simply welding the particles 11a and 11a. Unless the pressing force and the input electrical energy are optimized when welded, molten thermoelectric material may not be protruded around the connection part, or even if the molten thermoelectric material is protruded, the protruded amount may be too small. Also, even if an appropriate amount of the molten material is protruded, when its protruding direction is imbalanced, a large protrusion is formed at only one location, and a range (an interrupted portion) in which the protrusion does not exist sometimes extends around one half or more of the periphery in a position corresponding to the back side of the formed large protrusion.

Therefore, it is important to adjust the pressing force and the input electrical energy while also observing an amount of the protrusion 11b protruded and its protruding direction when welded, thereby enabling formation of the desired protrusion 11b without the interrupted portion remained around one half or more of the periphery.

Figure 1B:
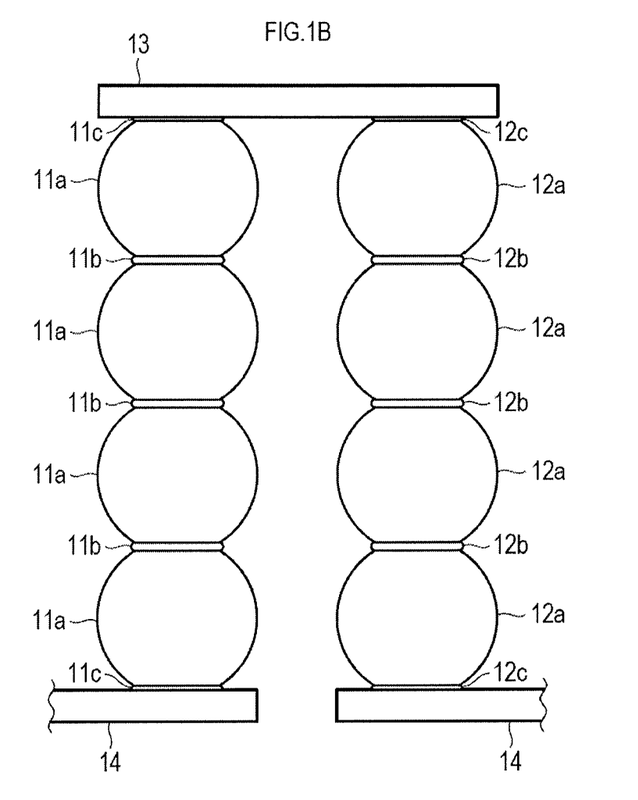
FIG. 1B is an enlarged view of thermoelectric conversion elements and electrodes.
Figure 2D:
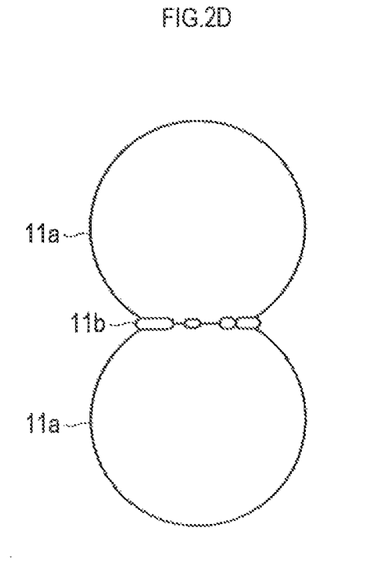
Figure 3A:
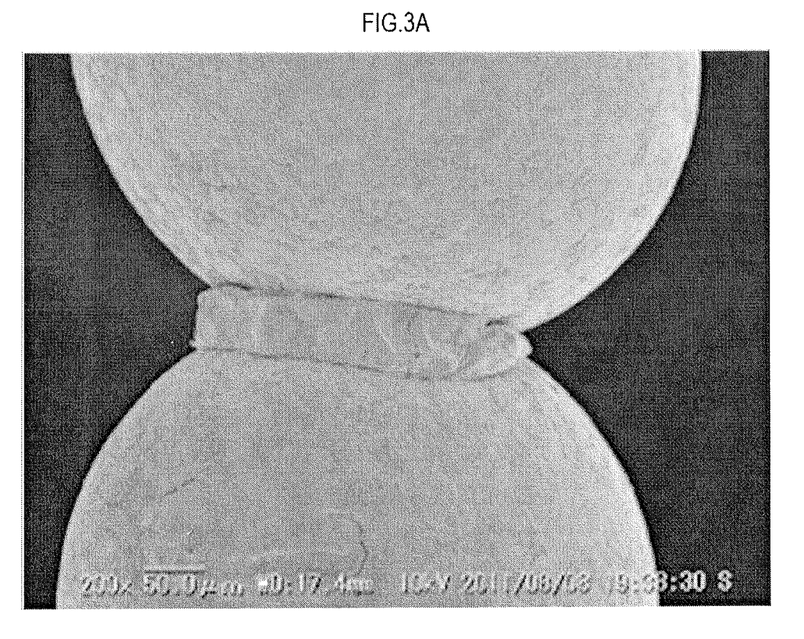
FIG. 3A is an electron micrograph of a connection part between particles.

The electron micrograph of the protrusion 11b formed by the above-described method is shown in FIG. 3A. In FIGS. 2A to 2D, the method for forming the protrusion 11b has been described by referring to the particles 11a as an example. However, when the particles 12a are utilized, a protrusion 12b can also be formed by the same method as for the particles 11a. In this connection, in the present example, by the same method as for the particles connected to each other, the electrode 13 and the particle 11a (12a) are directly connected to each other at a connection part between the electrode 13 and the particle 11a (12a), as shown in FIG. 1B. In the same manner, the electrode 14 and the particle 11a (12a) are directly connected to each other. Accordingly, protrusions 11c and 12c are also formed around their respective connection parts.

When the protrusions 11b and 12b as described above are formed, the mechanical strength in the connection part between the particles, in particular, the bending strength and tensile strength therein, are improved as compared to in the case of the element without an equivalent to the protrusion formed thereon. Specifically, in the case of the element without the equivalent to the protrusion, since the equivalent to the protrusion does not exist in a region where two particles are approaching each other by the bending force when a bending load acts on the element, no component inhibits bending of the element, so that the element is relatively easily broken.

On the other hand, when the protrusions 11b and 12b as described above are formed, the protrusions 11b and 12b exist in the region where two particles are approaching each other by the bending force when a bending load acts on the elements, so that the protrusions become a component for inhibiting the element from bending. Therefore, it is considered that the element is more difficult to be broken than the element without the protrusions 11b and 12b formed thereon.

In the case of the element without the equivalent to the protrusion formed thereon, the cross-sectional shape of the narrowed portion formed in the connection part comes to be a shape of tapered notch around almost the entire periphery. In contrast, when the protrusions 11b and 12b as described above exit, the cross-sectional shape of the narrowed part in the corresponding portion comes to be a shape in which a tip of the notch is buried with the protrusion. For this reason, it is considered that the element without the equivalent to the protrusion formed thereon is more likely to have a stress concentrated on a location corresponding to the tip of the notch, thereby to be likely to fracture at this location, and that when the protrusions 11b and 12b are provided, the stress concentrated on the connection part can be reduced, thereby improving bending strength and tensile strength.

In the present example, the protrusion 11b is protruded around the entire periphery of the connection part. However, as shown in FIG. 2D, the protrusion 11b may include interrupted portions to some extent. That is, this is because even if such an interrupted potion exists, the protrusion 11b can sufficiently function as a component for inhibiting bending of the element, so that the element becomes more difficult to be broken than that without the protrusions 11b and 12b formed thereon.

However, if one interrupted portion extends around one half or more of the periphery of the connection part, the bending strength of the interrupted portion to a bending that causes folding into a direction of two particles approaching each other is reduced. Therefore, in order to inhibit the reduction in bending strength, the circumferential length of one interrupted portion may be less than one half of the periphery of the connection part. In particular, when the circumferential length of the interrupted portion is preferably less than one third of the periphery, and more preferably less than one quarter of the periphery, the bending of the element can be inhibited by the protrusion further reliably.

Several specimens of the element in which the protrusion 11b was formed by the above-described method, and several specimens of the element in which connection was performed in the same method as above but the protrusion 11b was not formed were prototyped. With respect to these specimens, mechanical strength (breaking load) was measured using a mechanical testing machine capable of measuring micro load.

As used herein, the element with the protrusion 11b formed thereon means the element in which the protrusion is formed around the entire periphery of the connection part, or the element in which the interrupted portions partly occur, but the protrusion extends around almost the entire periphery and the interrupted portions are not observed around one half or more of the periphery. Also, as used herein, the element without the protrusion 11b formed thereon means the element in which the protrusion hardly exists, and even if the protrusion sparsely exists, a range without the protrusion extends around one half or more of the periphery of the connection part. The relationship between the connection diameter and the breaking load for each specimen is shown in Table 1 and FIG. 3B.

TABLE 1

| No. | Protrusion | Connection Diameter | Maximum Load (N) | Breaking |
|---|---|---|---|---|
| 1 | Present | 100 | 1.72 | Occurred |
| 2 | (Entire or | 115 | 4.92 | Occurred |
| 3 | almost | 128 | 6.81 | Not broken |
| 4 | entire | 145 | 5.79 | Not broken |
| 5 | periphery) | 154 | 6.56 | Not broken |
| 6 | Not present | 31 | 0 | Occurred |
| 7 | (Interrupted | 63 | 0 | Occurred |
| 8 | around one | 94 | 0 | Occurred |
| 9 | half or more | 111 | 3.93 | Occurred |
| 10 | of periphery) | 138 | 4.52 | Occurred |

Figure 3B:
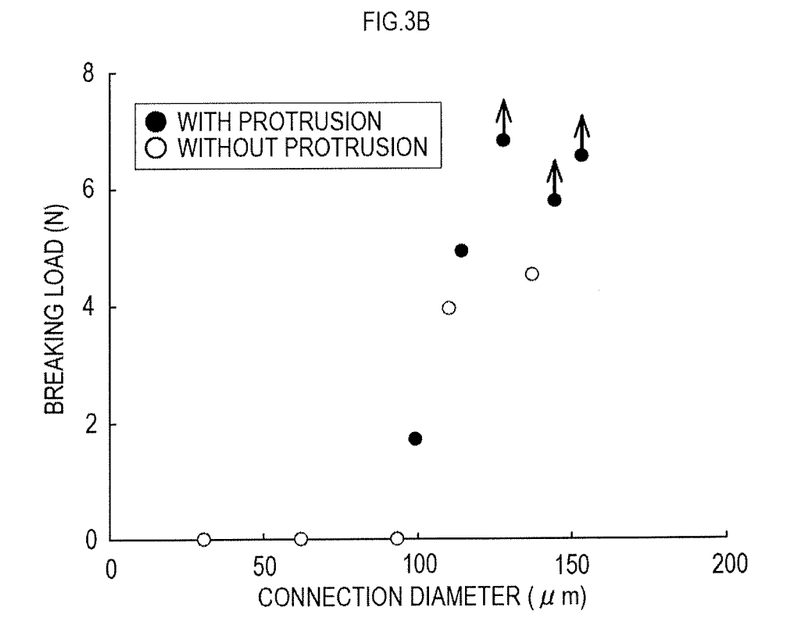
FIG. 3B is a graph showing a relationship between a diameter of the connection part and a breaking load.

The size of the diameter of the connection part (connection diameter) can be adjusted by adjusting the load applied to the particles and the electrical energy of the pulsed electrical current when welded. In the graph, data indicated with "●" corresponds to the element with the protrusion formed thereon, and data indicated with "○" corresponds to the element without the protrusion formed thereon. Furthermore, data without an arrow shows that the element fractured with the corresponding load, and data with an arrow shows that the element did not fracture with the corresponding load (that is, shows that further increasing the load in the arrow direction causes fracture to occur).

As apparent from Table 1 and FIG. 3B, when the protrusions 11b and 12b are present, the value of the breaking load tends to be larger even if the connection diameter is at the same level. From this tendency, it is apparent that the presence of the protrusions 11b and 12b improves the mechanical strength of the element.

In particular, the element without the protrusion fractured with a maximum load of 4.52 N even when the connection diameter was 138 μm, but the element with the protrusion did not fracture until the maximum load reached 4.92 N even when the connection diameter is 115 μm. Thus, it became apparent that even if the connection diameter is small, the presence of the protrusion improves the mechanical strength of the element.

Also, when the connection diameter was further increased to a range of 128 μm and more, the fracture of the element did not occur even if the maximum load was increased to 5.79 N and more. Thus, it became apparent that the element having very excellent mechanical strength can be obtained. Therefore, it is considered that the protrusion as described above is preferably formed in order to obtain an element having a resistance to a maximum load of 5 N or more.

Effect

According to the thermoelectric conversion module 1 as described above, each of the p-type element 11 and the n-type element 12 incorporated into the module is configured by aligning two or more particles 11a and two or more particles 12a, each composed of thermoelectric material, in series respectively, and connecting the particles to each other. Accordingly, the narrowed portion can be formed in the connection portion between the particles 11a or the particles 12a. Therefore, when a temperature difference is applied to both ends of each of the p-type element 11 and the n-type element 12 which are configured as above, heat flux is delayed at the narrowed portion so that the temperature difference between both ends of the element increases. Thus, thermoelectric conversion performance of the p-type element 11 and the n-type element 12 can be improved.

Also, each of the protrusions 11b and 12b formed with thermoelectric material is protruded around the connection part between the particles 11a connected to each other or the particles 12a connected to each other in the above-described p-type element 11 or n-type element 12. Therefore, the mechanical strength of the p-type element 11 and the n-type element 12 is improved as compared to in the case of the element without the equivalent protrusion.

OTHER EXAMPLES

The embodiment of the present invention has been described above by referring to the specific example. However, the present invention is not limited to the above specific example, and may be implemented in other various forms.

For example, in the above example, the Fe$_2$VAl-based thermoelectric material having a specific composition ratio has been exemplified as a p-type thermoelectric material and an n-type thermoelectric material. However, the composition ratio is merely one example, and may be appropriately changed within a range in which the performance as a p-type or n-type thermoelectric material can be maintained. Also, in the above embodiment, an example in which Si is added to $Fe_2VAl$-based thermoelectric material as the fourth element has been shown. However, another appropriate fourth element can also be added within a range in which the performance as a p-type or n-type thermoelectric material can be maintained.

Also, in the above embodiment, $Fe_2VAl$-based thermoelectric material has been exemplified. However, other thermoelectric material may be used. Examples of such thermoelectric material may include various types of alloy-based thermoelectric material such as Bi—Te based thermoelectric material, Mg—Si based thermoelectric material, Mn—Si based thermoelectric material, Fe—Si based thermoelectric material, Si—Ge based thermoelectric material, and Pb—Te based thermoelectric material.

What is claimed is:

1. A thermoelectric conversion element comprising:
    a plurality of particles, composed of thermoelectric material;
    the plurality of particles being sequentially arranged and directly connected to each other in series so that an overall structure of the thermoelectric conversion element forms a columnar arrangement of adjacent particles;
    adjacent particles, of the plurality of particles in the columnar arrangement, form an adjacent pair of the plurality of particles;
    a narrowed portion being formed between each adjacent pair of the plurality of particles in the columnar arrangement; and
    a protrusion being located between and coupling each adjacent pair of the plurality of particles to each other sequentially in series, and the protrusion being formed from thermoelectric material which protrudes outwardly from a connection point of the respective protrusion with each adjacent pair of the plurality of particles;
    wherein the protrusion has one of:
        a continuous shape extending around an entire periphery of the protrusion, or
        a shape in which one or more interrupted portions exist in a range of the entire periphery of the protrusion, and
        a circumferential length of any interrupted portion of the protrusion is less than one half of the entire periphery of the protrusion.

2. The thermoelectric conversion element according to claim 1, wherein each adjacent pair of the plurality of particles are melted to each other by application of a pressure load, pressing each adjacent pair of the plurality of particles against each other and simultaneously passing a pulsed electrical current through a contact point of each adjacent pair of the plurality of particles so that the thermoelectric material, in the contact point of each adjacent pair of the plurality of particles, is locally melted, by resistance heating caused by the pulsed electrical current, thereby welding each adjacent pair of the plurality of particles together.

3. A thermoelectric conversion module comprising:
    a plurality of p-type elements each composed of p-type thermoelectric material and a plurality of n-type elements each composed of n-type thermoelectric material, the plurality of p-type elements and the plurality of n-type elements being spatially arranged parallel to one another with a space provided therebetween;
    wherein on a first end side, one of the p-type elements and one of the n-type elements are electrically connected to each other via a first electrode;
    on a second end side, the one of the p-type elements and another one of the n-type elements are electrically connected to each other via a second electrode at least some of the p-type elements and at least some of the n-type elements are alternately connected electronically in series; and
    one or more of the plurality of p-type elements and the plurality of n-type elements is a thermoelectric conversion element comprising:
        a plurality of particles composed of thermoelectric material and linearly connected sequentially in series to each other, and adjacent particles, of the plurality of particles, form an adjacent pair of the plurality of particles; and
        a protrusion located between and coupling each adjacent pair of the plurality of particles to each other sequentially in series, and the protrusion being formed from thermoelectric material which protrudes outwardly from a connection point of the respective protrusion with each adjacent pair of the plurality of particles,
    wherein the protrusion has one of:
        a continuous shape extending around an entire periphery of the protrusion, or
        a shape in which one or more interrupted portions exist in a range of the entire periphery of the protrusion;
        a circumferential length of any interrupted portion of the protrusion is less than one half of the entire periphery of the protrusion;
        the plurality of particles are arranged so that an overall structure of the thermoelectric conversion element, of the one or more of the plurality of the p-type elements and the plurality of n-type elements, forms a columnar arrangement; and
        a narrowed portion is formed, in the columnar arrangement, between each adjacent pair of the plurality of particles in the thermoelectric conversion element of the one or more of the plurality of p-type elements and the plurality of n-type elements.

4. The thermoelectric conversion module according to claim 3, wherein each adjacent pair of the plurality of particles are melted to each other by application of a pressure load, pressing each adjacent pair of the plurality of particles against each other and simultaneously passing a pulsed electrical current through a contact point of each adjacent pair of the plurality of particles so that the thermoelectric material, in the contact point of each adjacent pair of the plurality of particles, is locally melted, by resistance heating caused by the pulsed electrical current, thereby welding each adjacent pair of the plurality of particles together.

5. The thermoelectric conversion module according to claim 3, further comprising a reinforcement provided between the plurality of p-type elements and the plurality of n-type elements.

6. The thermoelectric conversion module according to claim 3, wherein:
    the first end side is a low temperature side associated with first ends of the plurality of p-type elements and first ends of the plurality of n-type elements; and
    the second end side is a high temperature side associated with second ends of the plurality of p-type elements and second ends of the plurality of n-type elements.

7. The thermoelectric conversion module according to claim 3, further comprising a reinforcement provided between the plurality of p-type elements and the plurality of n-type elements, and wherein the reinforcement is a resin composition filled between the plurality of p-type elements and the plurality of n-type elements.

8. The thermoelectric conversion module according to claim 5, wherein the reinforcement is formed with a silicone resin-based potting material.

* * * * *